United States Patent
Zha et al.

(10) Patent No.: US 11,448,935 B2
(45) Date of Patent: Sep. 20, 2022

(54) LCD DEVICE AND OLED DISPLAY DEVICE

(71) Applicant: Wuhan China Star Optoelectronics Technology Co., Ltd., Hubei (CN)

(72) Inventors: Guowei Zha, Wuhan (CN); Fancheng Liu, Wuhan (CN)

(73) Assignee: Wuhan China Star Optoelectronics Technology Co., Ltd., Hubei (CN)

( * ) Notice: Subject to any disclaimer, the term of this patent is extended or adjusted under 35 U.S.C. 154(b) by 124 days.

(21) Appl. No.: 16/762,967

(22) PCT Filed: Dec. 19, 2019

(86) PCT No.: PCT/CN2019/126524
§ 371 (c)(1),
(2) Date: May 11, 2020

(87) PCT Pub. No.: WO2021/109261
PCT Pub. Date: Jun. 10, 2021

(65) Prior Publication Data
US 2021/0405426 A1    Dec. 30, 2021

(30) Foreign Application Priority Data
Dec. 2, 2019   (CN) .......................... 201911211328.7

(51) Int. Cl.
*G02F 1/137* (2006.01)
*G06V 40/13* (2022.01)
(Continued)

(52) U.S. Cl.
CPC ........ *G02F 1/13793* (2021.01); *G02F 1/1368* (2013.01); *G02F 1/13338* (2013.01); *G02F 1/133512* (2013.01); *G02F 1/133514* (2013.01); *G02F 1/133526* (2013.01); *G02F 1/133528* (2013.01); *G02F 1/134309* (2013.01);
(Continued)

(58) Field of Classification Search
CPC .............. G02F 1/294; G02F 1/133526; G02F 1/13338; G06F 3/0412; G06F 3/03547; G06K 9/00; G06K 9/00006; G06V 40/12
See application file for complete search history.

(56) References Cited

U.S. PATENT DOCUMENTS

2018/0143492 A1* 5/2018 Kao .................... G02F 1/13725
2019/0317374 A1* 10/2019 Yamazaki ........... H01L 27/1251
(Continued)

FOREIGN PATENT DOCUMENTS

CN    106526944 A    3/2017
CN    106873284 A    6/2017

*Primary Examiner* — Michael H Caley
*Assistant Examiner* — Jonathan Y Jung
(74) *Attorney, Agent, or Firm* — Luedeka Neely Group, PC

(57) ABSTRACT

A liquid crystal display (LCD) device and an organic light-emitting diode (OLED) display device are disclosed. The LCD device includes a base substrate, a display module, and a liquid crystal lens layer. The display module includes a fingerprint recognition sensor. The OLED display device includes a base substrate, a fingerprint recognition sensor, a two-layered liquid crystal lens layer, and an OLED display. The liquid crystal lens layer is configured to be switchable between a non-lens state and a lens state. By adopting liquid crystal lenses with holes, utilization of reflected light reflected by a fingerprint can be improved and imaging quality can be optimized.

3 Claims, 3 Drawing Sheets

(51) Int. Cl.
  *G02F 1/1333* (2006.01)
  *G02F 1/1335* (2006.01)
  *G02F 1/1343* (2006.01)
  *G02F 1/1368* (2006.01)
  *H01L 27/32* (2006.01)
  *G06V 10/145* (2022.01)
  *G06F 3/0354* (2013.01)
  *G06K 9/00* (2022.01)

(52) U.S. Cl.
  CPC ...... *G06V 40/1318* (2022.01); *H01L 27/3232* (2013.01); *G06F 3/03547* (2013.01); *G06K 9/00* (2013.01); *G06V 10/145* (2022.01)

(56) References Cited

U.S. PATENT DOCUMENTS

| | | | |
|---|---|---|---|
| 2020/0311372 A1* | 10/2020 | Yeh | G06K 9/0004 |
| 2020/0395416 A1* | 12/2020 | Bae | H01L 27/322 |
| 2021/0027035 A1* | 1/2021 | Tan | G06V 40/1318 |
| 2021/0215857 A1* | 7/2021 | Nichol | G02B 5/30 |

* cited by examiner

LCD DEVICE AND OLED DISPLAY DEVICE

BACKGROUND OF INVENTION

1. Field of Invention

The present invention relates to a technical field of displays, and particularly to, a liquid crystal display device and an organic light-emitting diode device.

2. Related Art

With ever-changing technologies, a trend in development is turning to full-screen mobile terminals. Fingerprint recognition technologies are widely used in mobile phones, tablets, televisions, access control, and safes due to their development. Fingerprint recognition technologies mainly include optical, capacitive, and ultrasonic types. Among them, optical fingerprint recognition technology provides a wider range of recognition and lower cost. Under-screen fingerprint recognition technology in full-screen mobile terminals has become a standard specification for flagship models of major brands of mobile phones. However, there is currently no liquid crystal display (LCD)-based under-screen fingerprint recognition products.

Based on LCD under-screen fingerprint recognition technologies, current mainstream solutions are as follows: hole imaging, lens, or lens array imaging solutions, etc., but each has its drawbacks.

For example, under-screen fingerprint recognition based on the hole imaging solutions is implemented by providing holes on sides of color filters using a principle of pinhole imaging. But light reflection also occurs when pixel opening areas are covered by a fingerprint, and light intensity of light passing through the opening areas is much greater than light intensity of light passing through the holes, thereby causing severe signal noise and adversely affecting acquisition of fingerprint recognition sensor signals. Under-screen fingerprint recognition can even be failed when accuracy of the sensors is not good enough.

In addition, micro lenses have large volume, heavy weight, single shape, and are fragile. Besides, for micro lenses, module design is difficult, mass production is hard to be achieved, production efficiency is low, and manufacturing costs are high. On the other hand, cover glasses are required to be attached to protect panels or to provide a certain object distance for lenses. Because under normal circumstances, a refractive index of an adhesive (such as optical clear adhesive, OCA) is relatively close to a refractive index of the lens, thereby significantly reducing performance of the lenses or even rendering the lenses ineffective. Furthermore, the micro lenses are presented as a solid form that may affect normal display while performing under-screen fingerprint recognition.

SUMMARY OF INVENTION

The present invention provides a liquid crystal display (LCD) device and an organic light-emitting diode (OLED) display device, applicable to under-screen fingerprint recognition techniques based on LCD and OLED, for increasing utilization of light, reducing influence of background signals, and improving accuracy of under-screen fingerprint recognition. A liquid crystal lens layer is used to replace conventional micro lenses and to overcome a problem of difficulty in designing conventional micro lens modules and inconvenience of assembly of the conventional micro lens modules, and to mitigate an influence of a solid form of the micro lenses on normal display of displays.

In order to overcome the above-mentioned problems, the present invention provides technical solutions as follows:

The present invention provides a liquid crystal display (LCD) device, comprising a backlight module disposed at a bottom of the LCD device; a display module disposed on the backlight module; and a liquid crystal lens layer disposed above the display module; wherein the display module comprises a fingerprint recognition unit, the liquid crystal lens layer is configured to operate in a lens state when the fingerprint recognition unit is operating, and the liquid crystal lens layer is configured to operate in a non-lens state when the fingerprint recognition unit is not operating; wherein the liquid crystal lens layer comprises a liquid crystal lens based on nematic liquid crystals and a liquid crystal lens based on blue phase liquid crystals, wherein a product of a difference value between a major axis and a minor axis of liquid crystal molecules in the liquid crystal lens layer and a distance value between the liquid crystal molecules is between 20 and 50.

According to the LCD device in the embodiment of the present invention, the display module comprises a bottom polarizer, a thin-film transistor (TFT) layer is disposed on a side of the bottom polarizer, a liquid crystal layer is disposed on a side of the TFT layer away from the bottom polarizer, a color filter plate is disposed on a side of the liquid crystal layer away from the TFT layer, the fingerprint recognition unit is disposed on a side of the color filter plate adjacent to the liquid crystal layer, and a top polarizer is disposed on another side of the color filter plate; wherein the fingerprint recognition unit comprises a fingerprint recognition sensor, the liquid crystal lens layer is disposed on a side of the top polarizer away from the color filter plate, and the LCD device further comprises a cover laminated on the liquid crystal lens layer.

According to the LCD device in the embodiment of the present invention, the liquid crystal lens layer comprises an upper substrate and a lower substrate for cell-assembly, and the liquid crystal lenses are disposed between the upper substrate and the lower substrate, wherein an upper electrode is disposed on a side of the upper substrate facing a direction for the cell-assembly, a lower electrode is disposed on a side of the lower substrate facing a direction for the cell-assembly, and the liquid crystal lenses configure a lens array under action of the upper electrode and the lower electrode.

According to the LCD device in the embodiment of the present invention, a black mask layer is disposed on a side of the color filter plate of the display module away from the liquid crystal layer, and the liquid crystal lens layer is provided with a lens array corresponding to an array of holes of the black mask layer, wherein the black mask layer takes up part of an aperture area provided by the LCD device.

According to the LCD device in the embodiment of the present invention, the black mask layer is a black matrix or is made of a black metal.

The present invention further provides a liquid crystal display (LCD) device, comprising a backlight module disposed at a bottom of the LCD device; a display module disposed on the backlight module; and a liquid crystal lens layer disposed above the display module; wherein the display module comprises a fingerprint recognition unit, the liquid crystal lens layer is configured to operate in a lens state when the fingerprint recognition unit is operating, and the liquid crystal lens layer is configured to operate in a non-lens state when the fingerprint recognition unit is not operating.

According to the LCD device in the embodiment of the present invention, the liquid crystal lens layer comprises a liquid crystal lens based on nematic liquid crystals and a liquid crystal lens based on blue phase liquid crystals.

According to the LCD device in the embodiment of the present invention, the display module comprises a bottom polarizer, a thin-film transistor (TFT) layer is disposed on a side of the bottom polarizer, a liquid crystal layer is disposed on a side of the TFT layer away from the bottom polarizer, a color filter plate is disposed on a side of the liquid crystal layer away from the TFT layer, the fingerprint recognition unit is disposed on a side of the color filter plate adjacent to the liquid crystal layer, and a top polarizer is disposed on another side of the color filter plate; wherein the fingerprint recognition unit comprises a fingerprint recognition sensor, the liquid crystal lens layer is disposed on a side of the top polarizer away from the color filter plate, and the LCD device further comprises a cover laminated on the liquid crystal lens layer.

According to the LCD device in the embodiment of the present invention, the liquid crystal lens layer comprises an upper substrate and a lower substrate for cell-assembly, and the liquid crystal lenses are disposed between the upper substrate and the lower substrate, wherein an upper electrode is disposed on a side of the upper substrate facing a direction for the cell-assembly, a lower electrode is disposed on a side of the lower substrate facing a direction for the cell-assembly, and the liquid crystal lenses configure a lens array under action of the upper electrode and the lower electrode.

According to the LCD device in the embodiment of the present invention, a product of a difference value between a major axis and a minor axis of liquid crystal molecules in the liquid crystal lens layer and a distance value between the liquid crystal molecules is between 20 and 50.

According to the LCD device in the embodiment of the present invention, a black mask layer is disposed on a side of the color filter plate of the display module away from the liquid crystal layer, and the lens array of the liquid crystal lens layer corresponds to an array of holes of the black mask layer, wherein the black mask layer takes up part of an aperture area provided by the LCD device.

According to the LCD device in the embodiment of the present invention, the black mask layer is a black matrix or is made of a black metal.

The present invention further provides an organic light-emitting diode (OLED) display device, comprising a display module, a two-layered liquid crystal lens layer disposed on a side of the display module, a fingerprint recognition unit disposed on a side of the two-layered liquid crystal lens layer away from the display module, a band-pass band reflection film provided on a side of the two-layered liquid crystal lens layer facing the fingerprint recognition unit, and an OLED display disposed on a side of the two-layered liquid crystal lens layer away from the band-pass band reflection film, and a cover disposed on an opposite side of the OLED display; wherein the fingerprint recognition unit comprises a fingerprint recognition sensor, the two-layered liquid crystal lens layer is configured to operate in a lens state when the fingerprint recognition unit is operating, and the two-layered liquid crystal lens layer is configured to operate in a non-lens state when the fingerprint recognition unit is not operating.

According to the OLED display device in the embodiment of the present invention, the two-layered liquid crystal lens layer comprises a liquid crystal lens based on nematic liquid crystals and a liquid crystal lens based on blue phase liquid crystals.

According to the OLED display device in the embodiment of the present invention, the two-layered liquid crystal lens layer comprises a first liquid crystal lens layer and a second liquid crystal lens layer, and the first liquid crystal lens layer is electrically connected to the second liquid crystal lens layer; wherein the first liquid crystal lens layer comprises a first upper substrate and a first lower substrate for cell-assembly, and a first liquid crystal lens is disposed between the first upper substrate and the first lower substrate, wherein a first upper electrode is disposed on a side of the first upper substrate facing a first cell-assembly direction, and a first lower electrode is disposed on a side of the first lower substrate facing the first cell-assembly direction, and wherein the second liquid crystal lens layer comprises a second upper substrate and a second lower substrate for cell-assembly, and a second liquid crystal lens is disposed between the second upper substrate and the second lower substrate, wherein a second upper electrode is disposed on a side of the second upper substrate facing a second cell-assembly direction, and a second lower electrode is disposed on a side of the second lower substrate facing the second cell-assembly direction.

The present invention has advantageous effects as follows: the invention provides an LCD device based on a display configured with a liquid crystal lens and a fingerprint recognition sensor to realize fingerprint touch. By adopting liquid crystal lenses with holes, utilization of reflected light reflected by fingerprints can be improved and imaging quality can be optimized. As to an OLED display device, a two layered liquid crystal lens structure is adopted to reduce signal receiving area of a fingerprint recognition sensor as well as manufacturing costs of fingerprint module. The liquid crystal lens structure is driven in a manner of time-sharing and is not in a lens state during normal display, except in a process of fingerprint recognition, thereby to reduce power consumption and influence of liquid crystal lenses on displaying.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

Figure 1:
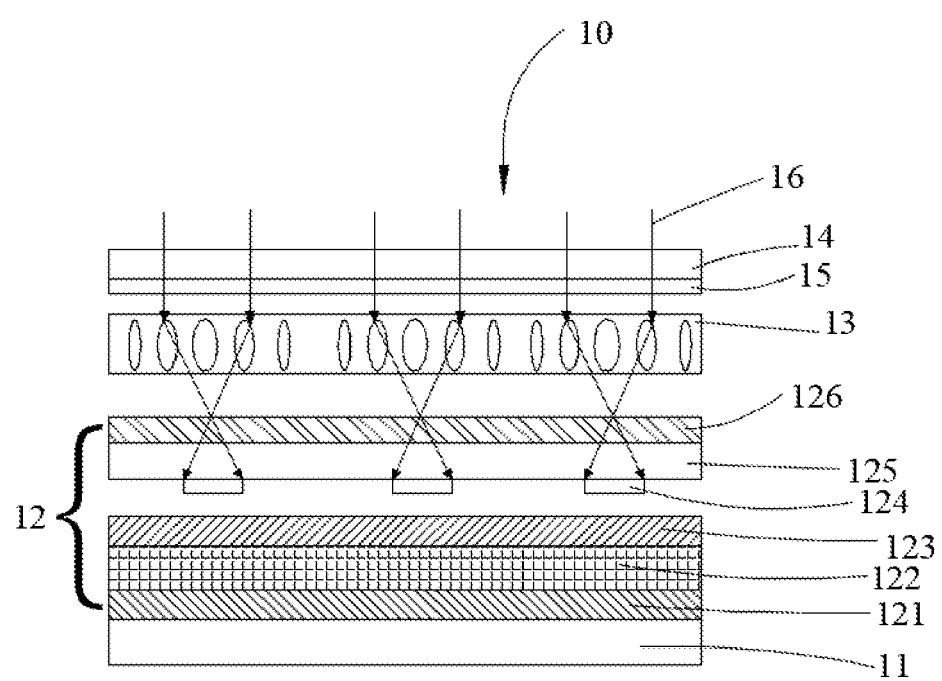
FIG. 1 is a schematic structural view of a display device in accordance with a first embodiment of the present invention.

The technical solutions in the embodiments of the present application will be clearly and completely described below with reference to the accompanying drawings in the embodiments of the present application. Obviously, the described embodiments are only a part of the embodiments of the present application, but not all the embodiments. Based on the embodiments in the present application, all other embodiments obtained by those skilled in the art without creative work fall into the protection scope of the present application.

In the description of the present application, it is to be understood that the term "center", "longitudinal", "lateral", "length", "width", "thickness", "upper", "lower", "front", "rear", "left", "right", "vertical", "horizontal", "top", "bottom", "inner", "outer", "clockwise", "counterclockwise" and the like indicates orientation or the orientation or positional relationship based on the positional relationship shown in the drawings, for convenience of description only and the present invention is to simplify the description, but does not indicate or imply that the device or element referred to must have a particular orientation in a particular orientation construction and operation, and therefore not be construed as limiting the present invention. Moreover, the terms "first" and "second" and the like are used for descriptive purposes only and are not to be construed as indicating or implying relative importance. Thus, features defining "first" or "second" may include one or more of the described features either explicitly or implicitly. In the description of the present application, the meaning of "a plurality" is two or more unless specifically and specifically defined otherwise.

In the present application, unless otherwise explicitly specified or limited, the terms "mounted", "linked", "connected", and like terms are to be broadly understood. For example, it may be a fixed connection, a detachably connection, or an integrally connection, or may be a mechanical connection, electrically connection, or a directly connection. Alternatively, it can also be connected indirectly through intervening structures, or may be interaction between the two internal communicating elements or two elements. Those of ordinary skill in the art, to be understood that the specific meanings in the present invention in accordance with specific circumstances.

In the present application, unless otherwise expressly specified or limited, the first feature being "on" or "lower" the second feature may include direct contact of the first and the second features and may also include that the first and the second features are not in direct contact, but in contact by the additional features therebetween. Also, the first feature being "on", "above", "upper" the second feature may include that the first feature is obliquely upward, directly above the second feature, or simply represent that a level of the first feature is higher than that of the second feature. The first feature being "beneath", "below" and "lower" the second feature may include that the first feature is obliquely downward and right below the second feature, or simply represent that a level of the first feature is less than that of the second feature.

The following disclosure provides many different embodiments or examples to achieve different structures of the present invention. To simplify the disclosure of the present invention, the components and configuration of specific examples are described hereinafter. Of course, they are only illustrative, and are not intended to limit the present invention. Further, the present disclosure may repeat reference numerals in different embodiments and/or the reference letters. This repetition is for the purpose of simplicity and clarity, and does not indicate a relationship between the various embodiments and/or set in question. Further, the present invention provides various specific examples of materials and processes, but one of ordinary skill in the art may be appreciated that other processes and applications and/or other materials.

The present invention is aimed to overcome drawbacks of conventional display devices that severe signal noise is likely to occur in a process of under-screen fingerprint recognition, thereby adversely affecting acquisition of fingerprint recognition sensor signals, and under-screen fingerprint recognition can't even be realized when accuracy of fingerprint recognition sensors is not good enough. Besides, a refractive index of an adhesive is relatively close to a refractive index of micro lens, thereby greatly reducing performance of the lens or even rendering the lens ineffective.

As shown in FIG. 1, the present invention provides a liquid crystal display (LCD) device 10. The LCD device 10 includes a backlight module 11 disposed at a bottom of the LCD device 10, a display module 12 disposed on the backlight module 12, a liquid crystal lens layer 13 disposed above the display module 12, and a cover glass 14 laminated on the liquid crystal lens layer 13 through an adhesive 15.

The display module 12 includes a fingerprint recognition unit including a fingerprint recognition sensor 124.

The display module 12 includes a bottom polarizer 121, a thin-film transistor (TFT) substrate and a TFT trace 122, a liquid crystal layer 123, a color filter plate 125, and a top polarizer 126.

The liquid crystal lens layer 13 is configured to operate in a lens state when the fingerprint recognition unit is operating, and the liquid crystal lens layer 13 is configured to operate in a non-lens state when the fingerprint recognition unit is not operating.

Embodiment 1

Please refer to FIG. 1 showing a schematic structural view of an LCD device 10 in accordance with the first embodiment of the present invention. The LCD device 10 is provided with a backlight module 11 disposed at a bottom of the LCD device 10. A bottom polarizer 121 is disposed on the backlight module 11. A TFT layer and a TFT trace 122 are fabricated on the bottom polarizer 121. Then, a liquid crystal layer 123 is fabricated on the TFT layer and the TFT trace 122. A color filter plate 125 is disposed on the liquid crystal layer 123. A fingerprint recognition sensor 124 is provided below the color filter plate 125. A top polarizer 126 is disposed on the color filter plate 125.

The bottom polarizer 121, the TFT layer and the TFT trace 122, the liquid crystal layer 123, the color filter plate 125, the fingerprint recognition sensor 124, and the top polarizer 126 cooperatively constitute a display module 12. A liquid crystal lens layer 13 is disposed above the display module 12, and a cover glass 14 is laminated to the liquid crystal lens layer 13 through an adhesive 15.

The liquid crystal lens layer 13 includes an upper substrate and a lower substrate for cell-assembly, and liquid crystal lenses are disposed between the upper substrate and the lower substrate. An upper electrode is disposed on a side of the upper substrate facing a direction for the cell-assembly, and a lower electrode is disposed on a side of the lower substrate facing a direction for the cell-assembly. The liquid crystal lenses configure a lens array under action of the upper electrode and the lower electrode.

In the first embodiment, in a process of performing under-screen fingerprint recognition, the LCD display device 10 uses the liquid crystal lens layer 13 to collect reflected light 16 reflected by a fingerprint, and concentrates the reflected light 16 on the fingerprint recognition sensor 124 through the liquid crystal lens layer 13. The fingerprint recognition sensor 124 then converts different light signals into electrical signals, thereby achieving fingerprint recognition. In this embodiment, the liquid crystal lens layer 13 can be powered up to form a lens array only in the process of performing the under-screen fingerprint recognition, otherwise the liquid crystal lens layer 13 is in a non-lens state, thereby to reduce influence on display of the LCD device 10 caused by the lenses.

In this embodiment, a product of a difference value between a major axis and a minor axis of liquid crystal molecules in the liquid crystal lens layer 13 and a distance value between the liquid crystal molecules is between 20 and 50.

Embodiment 2

Figure 2:
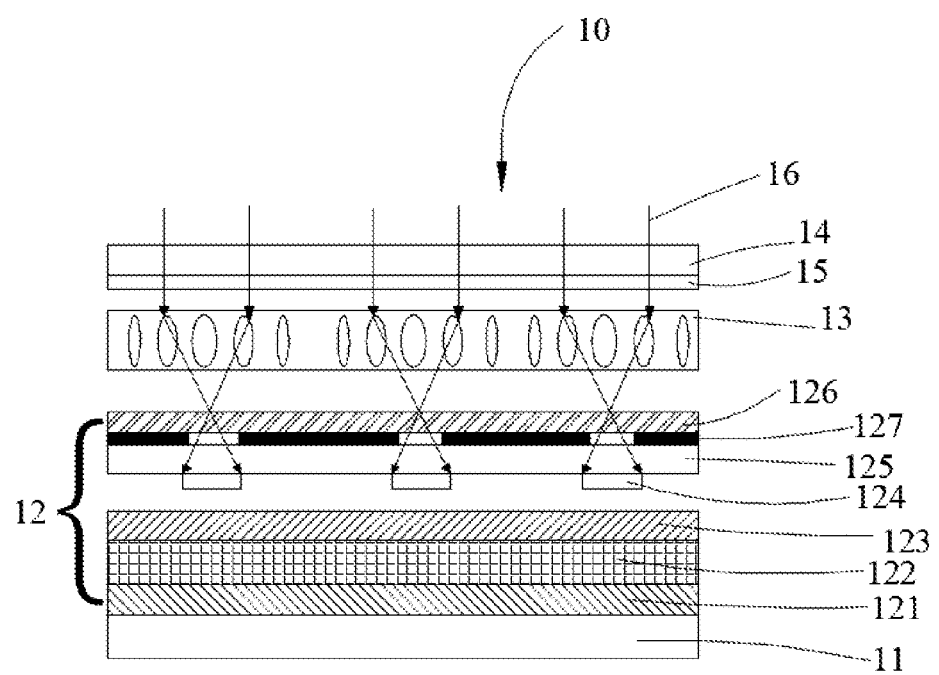
FIG. 2 is a schematic structural view of a display device in accordance with a second embodiment of the present invention.

Please refer to FIG. 2 showing a schematic structural view of an LCD device 10 in accordance with the second embodiment of the present invention. In comparison with the LCD display device 10 in the first embodiment, the LCD display device 10 in the second embodiment is provided with a black mask layer 127 disposed on the color filter plate 125 in the display module 12.

The lens array of the liquid crystal lens layer 13 corresponds to an array of holes formed by the black mask layer 127. By using lens focusing and pinhole imaging, a utilization of reflected light reflected by a finger can be maximized, thereby increasing recognizability of fingerprint touch. The black mask layer 127 is a black matrix or is made of a black metal, such as metal aluminum and molybdenum oxide.

The black mask layer 127 is disposed on the color filter plate 125, and is preferably disposed on an upper surface of the color filter plate 125. A position of stacking the black mask layer 127 in a longitudinal direction is the same as that of an original black matrix or a metal trace of a gate electrode and a source/drain electrode, or the black mask layer takes up part of an aperture area provided by the LCD device Embodiment 3

Figure 3:
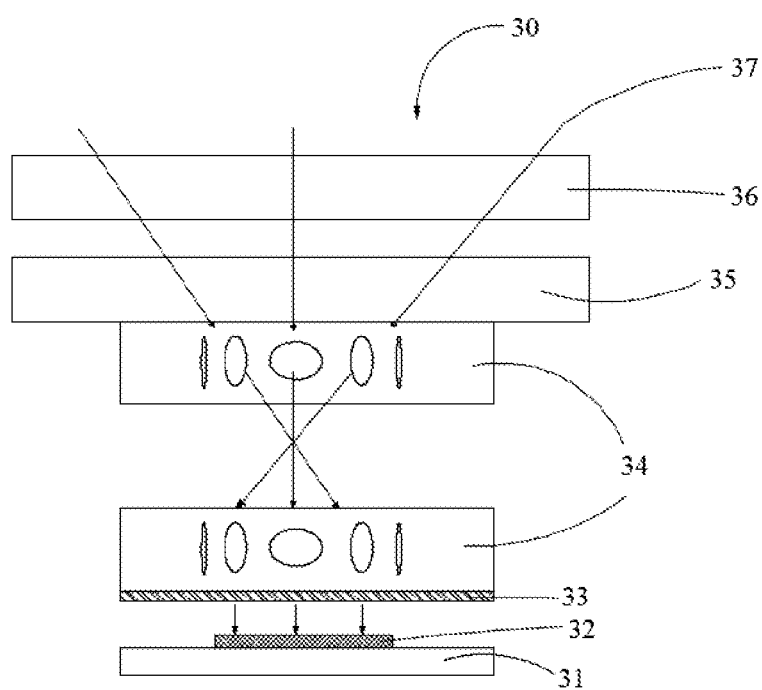
FIG. 3 is a schematic structural view of an organic light-emitting diode (OLED) display device in accordance with a third embodiment of the present invention.

Please refer to FIG. 3 showing a schematic structural view of an organic light-emitting diode (OLED) display device 30 in accordance with a third embodiment of the present invention. The third embodiment is directed to an OLED display device 30. The OLED display device 30 includes a base substrate and a base substrate trace 31 disposed on a bottom of the OLED display device 30. A fingerprint recognition unit 32 is disposed on the base substrate and the base substrate trace 31. A two-layered liquid crystal lens layer 34 is disposed above the fingerprint recognition unit 32. An OLED display 35 is disposed on the two-layered liquid crystal lens layer 34. A cover glass 36 is disposed on the OLED display.

The fingerprint recognition unit of the OLED display device includes a fingerprint recognition sensor.

The two-layered liquid crystal lens layer 34 is configured to operate in a lens state when the fingerprint recognition unit is operating, and two-layered liquid crystal lens layer 34 is configured to operate in a non-lens state when the fingerprint recognition unit is not operating. The two-layered liquid crystal lens layer 34 includes a first liquid crystal lens layer and a second liquid crystal lens layer, and the first liquid crystal lens layer is electrically connected to the second liquid crystal lens layer.

The first liquid crystal lens layer includes a first upper substrate and a first lower substrate for cell-assembly, and a first liquid crystal lens is disposed between the first upper substrate and the first lower substrate. A first upper electrode is disposed on a side of the first upper substrate facing a first cell-assembly direction, and a first lower electrode is disposed on a side of the first lower substrate facing the first cell-assembly direction. The second liquid crystal lens layer includes a second upper substrate and a second lower substrate for cell-assembly, and a second liquid crystal lens is disposed between the second upper substrate and the second lower substrate. A second upper electrode is disposed on a side of the second upper substrate facing a second cell-assembly direction, and a second lower electrode is disposed on a side of the second lower substrate facing the second cell-assembly direction.

The two-layered liquid crystal lens layer 34 configures a lens array under action of the upper electrode and the lower electrode. Light passes through the first liquid crystal lens layer to form a focal point between the first liquid crystal lens layer and the second liquid crystal lens layer, and further enters the second liquid crystal lens layer through the focus.

The two-layered liquid crystal lens layers 34 form a dual lens disposed on a lower surface of the OLED display 35. Dual liquid crystal lenses can reduce signal receiving area of the fingerprint recognition unit 32 as well as manufacturing costs of fingerprint modules. In the process of under-screen fingerprint recognition, reflected light 37 reflected by the fingerprint is concentrated at one point by the first liquid crystal lens layer, and forms a focal point on the two-layer liquid crystal lens layer 34. The reflected light 37 first reaches the second liquid crystal lens layer through the focal point, and is reflected by the second liquid crystal lens layer to reach the fingerprint recognition unit 32. The fingerprint recognition unit 32 then converts different optical signals into electrical signals, thereby realizing fingerprint recognition.

On any surface of the two-layered liquid crystal lens layer 34, a surface closest to the fingerprint recognition unit 32 is preferentially coated with a band-pass band reflection film 33 for filtering out unnecessary bands, thereby reducing signal noise ratio of the fingerprint recognition unit 32. For example, when a fingerprint recognition sensor receives a wavelength of 480 to 590 nanometers (nm), the band-pass band reflection film 33 can filter out a wavelength signal greater than 590 nm.

The liquid crystal lenses described in the first to third embodiments include all types of liquid crystal lenses, including but not limited to liquid crystal lenses based on nematic liquid crystals or based on blue phase liquid crystals. Liquid crystal molecules in this embodiment are biaxial crystals, and refractive indexes of the major axis and the minor axis are different. Define $^\Delta n$=n major axis–n minor axis. Through the configuration of pixel electrodes, an uneven electric field is generated at a center and edges of the liquid crystal lens layer, a voltage on a center is gradually higher than a voltage on edges, and then $^\Delta n$ with respect to both edges is gradually greater than $^\Delta n$ with respect to the center. In this manner, a spatial distribution of the refractive index forms a phase profile similar to a lens, producing lenses that are polarization-independent and can be adjusted in focus by voltage adjustment.

Liquid crystal lenses based on nematic liquid crystals have an advantage of a low driving voltage, and liquid crystal lenses based on blue phase liquid crystals have an advantage of quick response times.

The invention provides a display panel based on a display configured with a liquid crystal lens and a fingerprint recognition sensor to realize fingerprint touch. By adopting liquid crystal lenses with holes, utilization of reflected light reflected by fingerprints can be improved and imaging quality can be optimized. The liquid crystal lens is thin and light, with a relatively simple module structure, and therefore is easy for mass production. The liquid crystal lens functions without polarizers, and its light transmittance is greater than 90%. A focal length of the liquid crystal lens can be adjusted, improving debugging accuracy of fingerprint recognition. The liquid crystal lens shape is adjustable, and can be switched between a non-lens state and a lens state, thereby reducing influence on displaying. The liquid crystal lens relies on the change of the refractive index of the liquid crystal to achieve a lens focusing effect and is compatible with any refractive index of the refractive index materials of upper and lower surfaces of the liquid crystal lens, so lens performance will not be affected after a cover glass is used. A liquid crystal lens array is configured corresponding to a black mask layer to form an array of holes. By using lens focusing and pinhole imaging, utilization of reflected light reflected by fingers can be maximized and recognizability of fingerprint touch can be improved.

The LCD device and the OLED display device provided by the embodiments of the present invention are described in detail above. Specific examples are used in this article to explain the principle and implementation of this application. The descriptions of the above embodiments are only used to help understand the technical solution of this application and its core ideas. Those of ordinary skill in the art should understand that they can still modify the technical solutions described in the foregoing embodiments, or equivalently replace some of the technical features. These modifications or replacements do not make the essence of the corresponding technical solutions depart from the scope of the technical solutions of the embodiments of the present application.

What is claimed is:

1. A liquid crystal display (LCD) device, comprising:
   a backlight module disposed at a bottom of the LCD device;
   a display module disposed on the backlight module and comprising a color filter plate, a top polarizer disposed above the color filter plate and away from the backlight module, a black mask layer disposed on a side of the color filter plate and located between the color filter plate and the top polarizer, and a fingerprint recognition unit disposed on a side of the color filter plate away from the black mask layer, wherein the black mask layer is a black matrix or is made of a black metal, takes up part of an aperture area of the LCD device, and includes an array of holes pass passing through an upper surface and a lower surface of the black mask layer; and
   a liquid crystal lens layer disposed above the display module and comprising an upper substrate and a lower substrate for cell-assembly, and liquid crystal lenses disposed between the upper substrate and the lower substrate, wherein an upper electrode is disposed on a side of the upper substrate facing a direction for the cell-assembly, a lower electrode is disposed on a side of the lower substrate facing a direction for the cell-assembly, and the liquid crystal lenses configure a lens array corresponding to the array of holes of the black mask layer under action of the upper electrode and the lower electrode;
   wherein the liquid crystal lens layer is configured to operate in a lens state when the fingerprint recognition unit is operating, and the liquid crystal lens layer is configured to operate in a non-lens state when the fingerprint recognition unit is not operating.

2. The LCD device of claim 1, wherein the liquid crystal lens layer comprises a liquid crystal lens based on nematic liquid crystals and a liquid crystal lens based on blue phase liquid crystals.

3. The LCD device of claim 1, wherein the display module comprises a bottom polarizer, a thin-film transistor (TFT) layer is disposed on a side of the bottom polarizer, a liquid crystal layer is disposed on a side of the TFT layer away from the bottom polarizer, the color filter plate is disposed on a side of the liquid crystal layer away from the TFT layer, and the fingerprint recognition unit is located on the side of the color filter plate adjacent to the liquid crystal layer;
   wherein the fingerprint recognition unit comprises a fingerprint recognition sensor, the liquid crystal lens layer is disposed on a side of the top polarizer away from the color filter plate, and the LCD device further comprises a cover laminated on the liquid crystal lens layer.

* * * * *